(12) United States Patent
Stroessner et al.

(10) Patent No.: US 8,718,354 B2
(45) Date of Patent: May 6, 2014

(54) METHOD FOR ANALYZING MASKS FOR PHOTOLITHOGRAPHY

(75) Inventors: Ulrich Stroessner, Jena (DE); Thomas Scheruebl, Jena (DE)

(73) Assignee: Carl Zeiss SMS GmbH, Jena (DE)

( * ) Notice: Subject to any disclaimer, the term of this patent is extended or adjusted under 35 U.S.C. 154(b) by 460 days.

(21) Appl. No.: 12/934,423

(22) PCT Filed: Apr. 9, 2009

(86) PCT No.: PCT/EP2009/002668
§ 371 (c)(1), (2), (4) Date: Dec. 20, 2010

(87) PCT Pub. No.: WO2009/127368
PCT Pub. Date: Oct. 22, 2009

(65) Prior Publication Data
US 2011/0188732 A1    Aug. 4, 2011

Related U.S. Application Data

(60) Provisional application No. 61/044,970, filed on Apr. 15, 2008.

(30) Foreign Application Priority Data

Apr. 15, 2008   (DE) .......................... 10 2008 019 341

(51) Int. Cl.
G06K 9/00     (2006.01)
G06F 17/50    (2006.01)

(52) U.S. Cl.
USPC ............................................ 382/145; 716/51

(58) Field of Classification Search
None
See application file for complete search history.

(56) References Cited

U.S. PATENT DOCUMENTS

4,389,084 A    6/1983    Ban et al.
4,645,924 A    2/1987    Suzuki et al.
(Continued)

FOREIGN PATENT DOCUMENTS

DE    28 48 460    5/1979    .............. H01L 21/66
DE    33 43 145    6/1984    .............. G02B 27/00
(Continued)

OTHER PUBLICATIONS

T.G. Brown, "Inhomogeneous Polarization in Optical System Design", *International Optical Design Conference*, Proceedings of SPIE vol. 4832, pp. 198-205 (2002).

(Continued)

*Primary Examiner* — Barry Drennan
*Assistant Examiner* — David F Dunphy
(74) *Attorney, Agent, or Firm* — Fish & Richarson P.C.

(57) ABSTRACT

The invention relates to a method for analyzing masks for photolithography. In this method, an aerial image of the mask for a first focus setting is generated and stored in an aerial image data record. The aerial image data record is transferred to an algorithm that simulates a photolithographic wafer exposure on the basis of this data record. In this case, the simulation is carried out for a plurality of mutually different energy doses. Then, at a predetermined height from the wafer surface, contours which separate regions with photoresist from those regions without photoresist are in each case determined. The result, that is to say the contours, are stored for each of the energy doses in each case in a contour data record with the energy dose as a parameter. Finally, the contour data records are combined to form a three-dimensional multicontour data record with the reciprocal of the energy dose as a third dimension, and, on the basis of the transitions from zero to values different than zero in the contours, a three-dimensional profile of the reciprocal of the energy dose depending on the position on the mask is generated. This profile, the so-called effective aerial image, is output or stored or automatically evaluated. The same can also occur with sections through said profile.

20 Claims, 5 Drawing Sheets

(56) References Cited

U.S. PATENT DOCUMENTS

| | | | |
|---|---|---|---|
| 5,890,095 A | 3/1999 | Barbour et al. | |
| 6,049,660 A | 4/2000 | Ahn et al. | |
| 6,577,994 B1 | 6/2003 | Tsukuda | |
| 6,657,736 B1 | 12/2003 | Finarov et al. | |
| 6,690,469 B1 | 2/2004 | Shibata et al. | |
| 6,741,356 B1 | 5/2004 | Ishiwata et al. | |
| 6,765,651 B1 * | 7/2004 | Fiekowsky et al. | 355/77 |
| 6,924,893 B2 | 8/2005 | Oldenbourg et al. | |
| 6,954,911 B2 * | 10/2005 | Pierrat | 716/53 |
| 7,023,546 B1 | 4/2006 | McMillan | |
| 7,072,502 B2 | 7/2006 | Hemar et al. | |
| 7,120,285 B1 | 10/2006 | Spence | |
| 7,133,119 B1 | 11/2006 | Pettibone et al. | |
| 7,838,205 B2 * | 11/2010 | Chang et al. | 430/325 |
| 2002/0154303 A1 | 10/2002 | Maeda et al. | |
| 2002/0186879 A1 | 12/2002 | Hemar et al. | |
| 2004/0125373 A1 | 7/2004 | Oldenbourg et al. | |
| 2006/0126046 A1 * | 6/2006 | Hansen | 355/55 |
| 2007/0106973 A1 | 5/2007 | Lim et al. | |
| 2007/0121090 A1 | 5/2007 | Chen et al. | |
| 2007/0247604 A1 * | 10/2007 | Eib et al. | 355/53 |
| 2008/0037905 A1 | 2/2008 | Wegmann et al. | |
| 2008/0069432 A1 * | 3/2008 | Hsu et al. | 382/145 |

FOREIGN PATENT DOCUMENTS

| | | | |
|---|---|---|---|
| DE | 103 04 822 | 2/2004 | G01J 4/04 |
| JP | Hei 10-209041 | 8/1998 | H01L 21/027 |
| JP | 2001-014376 | 1/2001 | G06F 17/50 |
| JP | 2003-243280 | 8/2003 | H01L 21/027 |
| JP | 2003-525529 | 8/2003 | H01L 21/027 |
| JP | 2007-158328 | 6/2007 | H02L 21/027 |

OTHER PUBLICATIONS

Andreas Erdmann, "Process Optimization Using Lithography Simulation", *Proceedings of SPIE*, vol. 5401, pp. 22-36 (Oct. 6, 2003).

Tim Fühner et al., "Dr.Litho—A Development and Research Lithography Simulator", *Proceedings of SPIE*, vol. 6520, pp. 65203F-1-65203F-12 (Feb. 27, 2007).

Balint Meliorisz et al., "Increasing the Predictability of AIMS™ Measurements by Coupling to Resist Simulations", *Proceedings of SPIE*, vol. 7028, pp. 70282S-1-70282S-9 (Apr. 16, 2008).

John Randall et al., "Lithography Simulation with Aerial Image—Variable Threshold Resist Model", *Microelectronic Engineering*, vol. 46, pp. 59-63 (May 1, 1999).

B. Tollkühn et al., "Benchmark of a lithography simulation tool for next generation applications", *Microelectronic Engineering*, vol. 83, pp. 1142-1147 (Apr. 1, 2006).

English translation of Chinese Office Action for Patent Application No. 200980113449.6, dated Apr. 28, 2012 (4 pages).

English translation of Japanese Office Action for Patent Application No. 2011-504359 by Patent Examination First Section Nano-Physics: Shigeo Arai, dated Jan. 30, 2013 (3 pages).

* cited by examiner

METHOD FOR ANALYZING MASKS FOR PHOTOLITHOGRAPHY

This application is the National Stage of International Application No. PCT/EP2009/002668, filed Apr. 9, 2009, which claims priority to German Application No. 10 2008 019 341.0, filed Apr. 15, 2008, and U.S. Provisional Patent Application No. 61/044,970, filed Apr. 15, 2008. The contents of the above applications are incorporated by reference in their entireties.

The invention relates to a method for analyzing masks for photolithography, wherein a photolithographic wafer exposure is simulated.

In the production of semiconductor structures such as are used in computer technology in processors and recently increasingly in exchangeable storage media, too, the development is tending toward producing ever smaller structures on the same area. Currently available computer chips consist approximately of 30 different layers lying one above another, and the size of the functional structures, of the so-called features is approximately 45 nm. The photolithography masks used for producing these features have to produced with correspondingly high accuracy. In this case, a wafer is exposed up to thirty times, but a different mask is required for each layer.

For the analysis and final inspection of masks for photolithography under lithographic conditions, aerial image analysis, for example with the aid of the AIMS from Carl Zeiss SMS GmbH, has long been known and established. In this case, the mask is exposed with the same exposure settings and with the same wavelength as will be used later in the photolithography. In contrast to the photolithography, where the mask structure is imaged onto the wafer in highly demagnified fashion, the AIMS is used to generate magnified aerial images that are imaged onto a detection unit, for example a CCD camera, digitized and stored. The aerial image thus corresponds to the image that would be generated in the photolithography scanner on the photoresist layer. The photolithography mask can therefore be examined for correct lithographic behavior with the aid of the AIMS, without expensive test series having to be exposed.

A different method enabling test series to be dispensed with is described for example in DE 197 57 696 B4. In the simulation method disclosed therein, all steps are simulated without a genuine mask ever having to be used. Firstly, a virtual image or an intermediate image is calculated, which corresponds to the aerial image of the mask. For this purpose, the mask layout is used for the calculation. Said mask layout then influences the simulation of the exposure of the photoresist. In order to generate input data from the virtual image, a threshold value model is applied to the image, which threshold value model yields as the result whether or not there is a mask structure at a location in the image. A simulation of the development of the photoresist layer is then carried out depending on the threshold values. In the case of a positive photoresist, the development means that the photoresist is altogether resolved or consumed above the threshold value, whereas it remains at locations where the intensity values in the intermediate image lie below the threshold value. This very simple model is improved by the invention described in DE 197 57 696 B4 in that firstly an aerial image is simulated and this aerial image is subsequently considered in the manner of an acid distribution, wherein the acid distribution is produced from a photoresist in an exposure process. This yields a diffusion intermediate image taking account of the diffusion of the acid in a curing process that takes place after the exposure. Finally, this diffusion intermediate image is converted into a threshold value model, such that it is possible to modulate the expected size of the contours in the photoresist. One advantage of this method is that it is not necessary to simulate the whole process taking account of the exposure and development of the three-dimensional photoresist layer, which also comprises a diffusion along the Z direction. The acid distribution or the photoresist layer is approximated by a two-dimensional plane, that is to say that it is assumed that the photoresist layer is very thin, which constitutes a great approximation.

U.S. Pat. No. 7,072,502 B2 describes a method for examining phase shift masks (PSM). This involves recording a number of aerial images of the mask, which are then used for the simulation of an exposure and development of the photoresist. The aerial images essentially differ in that they are recorded at different focus settings. On the basis of the images recorded at different Foki, or the exposures simulated therefrom, it is impossible to draw conclusions about defects on the mask. The simulation of the wafer exposure is three-dimensional here.

The methods known in the prior art make it possible to analyze masks more or less accurately. In some instances, however, the evaluation of the results of the simulation is extremely complicated, for example if different focus stacks of aerial images are recorded for different energy doses, that is to say the energy which impinges on the wafer surface per unit area, and an exposure simulation is carried out for each focus stack in order for example to determine the process window.

It is an object of the invention to further develop a method for analyzing masks for photolithography to the effect that the analysis is simplified and accelerated.

A method for analyzing masks for photolithography which achieves this object comprises the following steps:

Firstly, an aerial image of the mask for a first focus setting is generated and stored in an aerial image data record. The aerial image data record is transferred to an algorithm that simulates a photolithographic wafer exposure. Such a simulation of a photolithographic wafer exposure consists in the fact that the exposure and development of a photoresist layer having a predetermined thickness that is applied to the surface of a wafer is simulated for predetermined exposure parameters—inter alia for a predetermined energy dose. On the basis of the aerial image data record, the algorithm can ascertain the extent to which the photoresist layer is exposed at a specific position on the wafer. The algorithm simulates, inter alia, the chemical treatment and development of the photoresist. The result of the simulation corresponds in the general case, in principle, to the three-dimensional profile of the photoresist layer on the wafer after the development reproduces. In the method according to the invention, the simulation is then carried out for at least two mutually different energy doses. At a predetermined height from the wafer surface, contours which separate regions with photoresist from regions without photoresist are then in each case determined. The result, the contours, are stored for each of the energy doses in each case as a two-dimensional contour data record with the energy dose as a parameter.

The aerial image can in this case be generated in various ways. One conventional and very accurate method consists in generating the aerial image by means of an emulation imaging system that emulates the imaging of the mask onto a photoresist layer in a photolithography scanner. Such an emulation imaging system is for example the AIMS from Carl Zeiss SMS GmbH. In this special microscope, generally the same settings are used for the illumination, for example concerning wavelength, polarization, mask-side numerical aperture. This is not mandatory, however; more simply constructed microscopes can also be used in which case it may then be necessary to accept reduced expectations regarding accuracy.

Another possibility consists in not only simulating the exposure but also simulating the aerial image by means of an aerial image simulation algorithm. Such programs are likewise commercially available and use the data of the mask layout which are stored in a mask design file, or the measured structure of actually existing masks.

Programs for the simulation of wafer exposures are commercially available, for example Solid E from Synopsys Inc., Panoramics from Panoramic Technology or Prolith from KLA Tencor. One simple configuration of such a photoresist simulation is based on the fact that, in a first step, a three-dimensional convolution with a Gaussian function is applied to the data of the aerial image data record, and this modifies the intensity distribution. This takes account, inter alia, of the diffusion within the photoresist, that is to say the intermixing of exposed and unexposed particles during the exposure and development. Since only the photoresist layer at a predetermined height is of interest, however, in the present case, the convolution can also be restricted to this region, that is to say that a diffusion perpendicular to the wafer surface does not have to be taken into account, in other words a two-dimensional convolution with a Gaussian function without the vertical component is sufficient. The accuracy of the result is thereby reduced only slightly. Nevertheless, there are differences with respect to a purely two-dimensional photoresist layer, since the photoresist layer is situated at a certain height as measured from the wafer surface, for example in a range of 5%-15% of the total thickness of the photoresist layer, that is to say indeed in the vicinity of the wafer surface, but not on it. The time required for this layer that lies deeper and not at the surface of the photoresist also to be exposed must therefore likewise be taken into account. By way of example, the absorbed energy and the focus position are influenced by the depth of the photoresist layer. This constitutes an important difference with respect to the model described in DE 197 57 696 B4. If, after a two-dimensional convolution, in a second step, a threshold value function is applied which yields a value having a value different than zero when photoresist is present, and zero otherwise, then the result is independent of the height above the wafer surface, such that the result can be directly stored two-dimensionally in a contour data record.

Should there be no desire to use this simplifying two-dimensional approximation, aerial images at different focus settings can also be generated—recorded or simulated—and combined in the aerial image data record to form a three-dimensional aerial image, the extent of which extends parallel to the optical axis from the underside to the top side of the photoresist layer. In this case, the focus positions have to be correspondingly converted in a known manner, in which case the imaging scale and also the refractive index of the photoresist have to be taken into account. If only a small number of aerial images with different focus settings are available, then it is possible to interpolate between them or even extrapolate outside them.

In principle, it is also possible, of course, first to calculate the three-dimensional photoresist profile and subsequently to carry on working using said profile. In a simulation in all three spatial directions, the contours can then be determined by carrying out at least one section parallel to the wafer surface at the predetermined height after the simulation of the photographic exposure for each of the data records obtained from the simulation.

Moreover, sections can be carried out not only at one height but at a plurality of heights in a range of predetermined thickness around the predetermined height, such that as it were a layer is cut out for each of the data records obtained from the simulation. The contours are then determined by averaging over the thickness of the layer and stored in the contour data records.

Once at least two contour data records have been generated, they are combined to form a three-dimensional multicontour data record with the process threshold or the reciprocal of the energy dose as a third dimension. On the basis of the transitions from zero to values different than zero in the contours in the multicontour data record, a three-dimensional profile of the energy dose depending on the position on the mask is generated. Instead of the energy dose, the reciprocal of the energy dose or some other function of the energy dose depending on the position on the mask can advantageously also be output as the result or used as a third dimension. Such a multicontour data record can be composed for example from 80 or more contour data records. The edges of the contours are used for determining the profile; this can be approximated for example by a multidimensional polynomial.

The reciprocal of the energy dose is proportional to the so-called process threshold. A process threshold of 0.25 means that ¼ of the light which impinges on a region of the mask without a structure suffices to develop the photoresist layer. This corresponds to a high dose, that is to say also to a high intensity, if the exposure time is always the same. This profile or sections through this profile can then be output and/or stored in a profile data record and/or automatically evaluated. By way of example, a direct comparison with the aerial image recording can be carried out. For this purpose, it is advantageous if both the aerial image data record and the profile are normalized to the exposure through a light-transmissive region of the mask. The profile obtained does not correspond to a spatial profile of the photoresist layer on the wafer, but rather to an effective aerial image, that is to say the photoresist distribution on the wafer depending on the energy dose with which the photoresist layer is exposed. It can readily be inferred from this, by way of example, how the critical dimension will change upon alteration of the energy dose; the behavior of other process variables can also be inferred.

It goes without saying that the data generated during the simulation can be utilized not just exclusively for further processing to form profiles, rather transfer to further algorithms for further evaluation is also possible.

Preferably, contrast losses as a result of vector effects are also taken into account when generating each aerial image data record. This can be achieved both computationally and by optical measures when generating the aerial image, as described for example in the patent families DE 10 2004 033 603 A1, DE 10 2004 033 602, the disclosure of which is expressly incorporated here. The vector effects are therefore already taken into account before the aerial image data records are transferred to the algorithm; therefore, they only have to be calculated once for each aerial image, irrespective of the number of energy doses for which simulations are carried out and contour data records are thus generated.

In one preferred configuration of the invention, further aerial images at further focus settings are recorded, that is to say focus stacks are generated. These further aerial images are stored as further aerial image data records and transferred to the algorithm. The latter generates further contour data records, multicontour data records and subsequently further profiles, which are stored in further profile data records and/or evaluated together with the initially determined profile and/or output wholly or in sections. In each of the focus settings, the focus is set differently, that is to say that the focal plane in each case lies at different locations; it can, inter alia, also lie outside the photoresist layer. The simulation with corresponding variation of the energy dose is applied to each aerial image recorded in this focal plane and a corresponding profile is generated. On the basis of these profiles, it is then possible to perform further evaluations, for example a graphical representation of the line width depending on the process threshold, representations of Bossung curves, an analysis of the process window or the determination of the pivot point, that is to say the dose for which no significant changes in the position of the contours arise in the case of varying focusing. Upon variation of the energy dose, therefore, without any further outlay statements are also obtained about the extent to which a defocusing affects the extent of the contours and, derived therefrom, of the critical dimension.

The method according to the invention can also be applied to the multiple exposure of wafers, such as is used for example during double patterning. At a focus setting, an exposure of the wafer successively using at least two masks then means that aerial image data records are generated for both masks and are added pixel by pixel to the aerial image data record. The photoresist layer is therefore exposed twice, as it were, before it is developed. Another possibility consists in generating aerial image data records for both masks. The aerial image data record for the mask used first to effect exposure is then transferred to the algorithm, wherein, for one or a plurality of mutually different energy doses, the exposure and development of a photoresist layer applied to the surface of a wafer are in each case simulated on the basis of said aerial image data record. Subsequently, the aerial image data record for the mask used subsequently to effect exposure is transferred to the algorithm and a corresponding procedure is likewise adopted for one or a plurality of energy doses. The data resulting from the simulation are then presented jointly, combined to form a data record and/or processed further. Preferably, the data generated from the aerial image record of the mask used first to effect exposure are taken into account in each case. This corresponds to the application of a new photoresist layer after exposure with the first mask and before exposure with the second mask. This is expedient particularly when an etching process was simulated after the first exposure, such that the wafer surface is no longer planar.

Finally, the above-described analysis on the basis of the representation or evaluation of multicontour data records for photolithography processes can also be carried out with genuine resist profiles. For this purpose, a wafer is exposed by means of the mask and a projection exposure device such as a scanner for at least two energy doses and is subsequently developed, wherein, before each renewed exposure, the photoresist layer is renewed or else a different location of the wafer is used. After the development, the resist profiles produced are scanned, for example by means of a scanning electron microscope (SEM). The results are in each case stored in resist profile data records. On the basis of the resist profile data records, contours which separate regions with photoresist from those regions without photoresist are in each case determined, and the result is stored in each case as a two-dimensional contour data record. The contour data records are then combined to form a three-dimensional multicontour data record and represented and/or evaluated in the manner described above.

It goes without saying that the features mentioned above and those yet to be explained below can be used not only in the combinations specified, but also in other combinations or by themselves, without departing from the scope of the present invention.

The invention is explained in even greater detail below by way of example with reference to the accompanying drawings, which also disclose features essential to the invention and in which.

In a method for analyzing masks for photolithography, the first step involves recording an aerial image of the mask at a focus setting. In this case, the focus is situated in a plane which in reality lies in the region of a photoresist layer applied to a wafer. The image is subsequently digitized and stored in an aerial image data record. This aerial image data record is then transferred to an algorithm that simulates a photolithographic wafer exposure. Depending on predetermined parameters such as the energy dose—that is to say the energy input per unit area—, the exposure and development of a photoresist layer applied to the surface of a wafer and having a predetermined thickness is simulated. In this case, the aerial image data record defines those locations on the photoresist layer on which light impinges and those on which it does not. Exposure and development are then simulated depending on the type of photoresist. In the case of a positive photoresist, this means that during development the exposed locations are washed out or freed of the photoresist depending on the energy dose. If the energy dose is not high enough, then the photoresist remains. A negative photoresist is distinguished by the fact that it hardens or becomes chemically stable upon exposure, such that during development only the unexposed areas of the photoresist are uncovered or the exposed areas to such an extent as energy is input. In addition, after the exposure and before and/or during the development, the exposed components of the photoresist can still move a certain distance, the so-called diffusion length. This leads to a certain blurring of the image. FIG. 1a illustrates for a predetermined energy dose D, for example, the customary three-dimensional profile of the photoresist layer on the wafer, but only in a section along a predetermined direction on the wafer surface, for example in an X-Z section. A negative photoresist is involved here, that is to say that the higher the energy dose, the more photoresist remains, in principle, at the edges on the wafer layer.

In this case, the aerial image can be generated in various ways. One conventional and very accurate method consists in generating the aerial image by means of an emulation imaging system that emulates the imaging of the mask onto a photoresist layer in a photolithography scanner. Such an emulation imaging system is for example the AIMS from Carl Zeiss SMS GmbH.

Another possibility consists in not only simulating the exposure but also simulating the aerial image by means of an aerial image simulation algorithm. The generation of a three-dimensional aerial image on the basis of aerial images that were recorded at different focus settings also exists. Moreover, sections can be carried out not only at one height, but at a plurality of heights in a range of predetermined thickness around the predetermined height, such that a layer is as it were cut out for each of the data records obtained from the simulation. The contours are then determined by averaging over the thickness of the layer and stored in the contour data records.

In the method described here, simulations are then carried out for at least two mutually different energy doses and, from the data records generated during the simulation, at a predetermined height from the wafer surface, contours which separate regions with photoresist from regions without photoresist are determined. The result is stored in each case as a two-dimensional contour data record with the energy dose as a parameter.

In the case of a three-dimensional photoresist profile as shown in FIG. 1a, it suffices to make at least one section through the profile at the predetermined height in order to attain the contours or contour data records. Moreover, sections can be carried out not only at one height, but at a plurality of heights in a range of predetermined thickness around the predetermined height, such that a layer is as it were cut out for each of the data records obtained from the simulation. The contours are then determined by averaging over the thickness of the layer and stored in the contour data records.

A two-dimensional contour data record containing for example the contours shown in FIG. 1b is obtained in this way. By way of example, a value of approximately 10% of the original thickness of the photoresist layer, measured from the wafer surface, can be predetermined as the height. For further analyses this is closer to reality than, for example, a value at 90% of the original thickness. In this case, 10% is only an approximate value; a deviating stipulation of the height with a value of 5% or 15% of the original thickness is likewise possible; realistic results can likewise still be obtained with these values.

On account of the fact that contours are determined and a complete simulation of the behavior of the three-dimensional photoresist structure during the development is therefore necessary, in principle, the algorithm for the simulation of the wafer exposure can be simplified in various points. Thus, by way of example, the spatial diffusion perpendicular to the surface can be disregarded. This has the effect that, by comparison with the customary procedure wherein a three-dimensional convolution of the input data with a Gaussian function is effected during the simulation, now only a two-dimensional convolution is necessary since solely the contours are of interest. If a photoresist simulation according to Dill is stipulated, for example, that is to say an equation of the form $A=1-\exp(-I_{aerial\,image}\,C-D)-B$, then the inhibitor concentration resulting from the three-dimensional convolution of the function A with a Gaussian function is crucial for the description of the diffusion. In this case, $I_{aerial\,image}$ is the intensity of the light distribution in the photoresist. C is the parameter C from the Dill model and specifies the light sensitivity of the photoresist. D is the energy dose of the exposure. Finally, B is the concentration of the base in the photoresist and A is the concentration of the photo acid generated. The variables A and B are normalized to the initial concentration of the photo acid generator before exposure. The contours thus arise directly from the simulation since they are independent of the height.

Should there be no desire to use this simplifying two-dimensional approximation, aerial images at different focus settings can also be generated—recorded or simulated—and combined in the first aerial image data record to form a three-dimensional aerial image, the extent of which extends parallel to the optical axis from the underside to the top side of the photoresist layer. In this case, the focus positions have to be correspondingly converted in a known manner, in which case the imaging scale and also the refractive index of the photoresist have to be taken into account. If only a small number of aerial images with different focus settings are available, then it is possible to interpolate between them or even extrapolate outside them.

Since only the contours after the end of the development are of interest, it is also possible to disregard the step of developing the photoresist depending on the time and the rate with which the photoresist is developed as a function of the concentration of the inhibitor. A threshold value function for the photo acid is stipulated instead. For a positive photoresist this means that the photoresist is stripped away at the locations where the concentration of the photo acid exceeds a certain threshold value concentration after the diffusion; otherwise, the photoresist remains. The situation is reversed for negative photoresist. This leads to a significant acceleration of the calculations, though this is relativized again somewhat if contrast losses as a result of vector effects are taken into account when generating the aerial image data record. However, these only have to be calculated once for each aerial image. A separate calculation for each energy dose is not necessary.

If a series of such contour data records, but at least two, have been determined, then the contour data records generated from an aerial image can be combined to form a three-dimensional multicontour data record with the energy dose or a function of the energy dose such as the reciprocal of the energy dose as a third dimension. This multicontour data record can already be represented graphically, for example as a three-dimensional view of a layer stack or as a two-dimensional section through said layer stack, as illustrated in FIG. 1c. In the present example, a negative photoresist is involved, that is to say that at a high dose the entire photoresist layer is exposed and therefore becomes insoluble under the action of a developer. This is illustrated by the solid lower line in FIG. 1c. The overlying line segments correspond to the contours such as arise at a lower energy dose, the overlying line segments correspond to contours generated at an even lower energy dose, etc., until the dose is so low that the entire photoresist is removed during development. Only four lines are illustrated in FIG. 1c for the sake of clarity, but in reality contours for 80 energy doses or more, for example, can be generated relatively rapidly, virtually in real time, which increases the accuracy.

On the basis of the transitions from zero to values different than zero in the contours in the first multicontour data record, a three-dimensional profile of the energy dose or of a function of the energy dose such as the reciprocal of the energy dose depending on the position on the mask is then generated. This is illustrated in greater detail in FIG. 1d. The transitions from zero to the values different than zero in the contours determine the edges of the contours. The profile is chosen such that it envelopes these contours, for example by using the data points on the contour edges as support points for an approximation with a multidimensional polynomial. The edges of the contours then all lie on the profile.

In a last step, the profile and/or sections through the profile are/is output. For the example in FIG. 1, this is illustrated in FIG. 1e, a section through the profile along a direction on the surface of the wafer.

Figure 2:
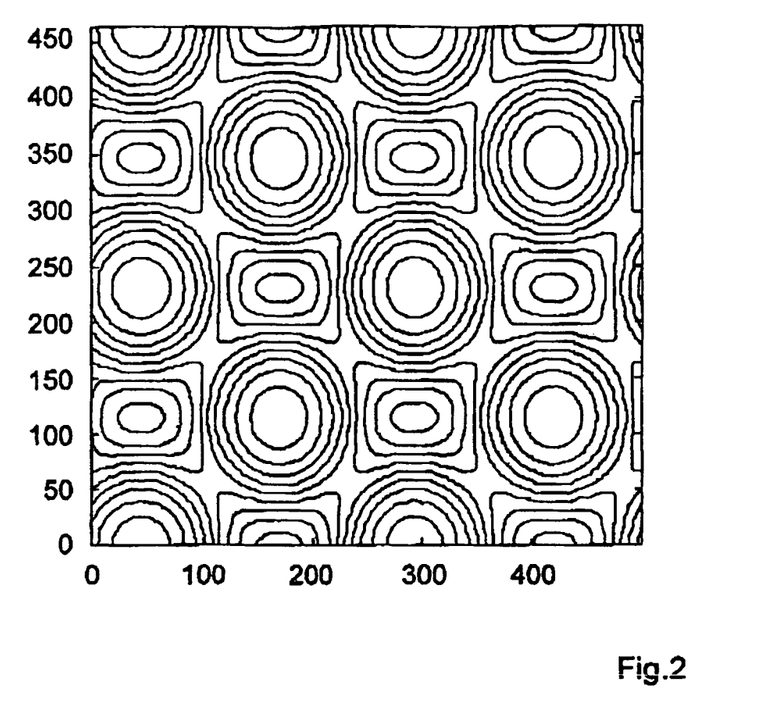
FIG. 2 shows a plan view of a profile.

It goes without saying that the profile can also be stored in a profile data record as a three-dimensional data record; further processing, in particular automatically, is also possible by means of corresponding evaluation algorithms. By way of example, from the profile it is also possible to determine the critical dimension depending on the process threshold—proportional to the reciprocal of the energy dose—; the determination of process windows, NILS representations (NILS=normalized image log-slope), Bossung curves, etc. is also possible. FIG. 2 shows a plan view of the three-dimensional profile; in a manner similar to the configuration of topographical maps with contour lines, each of the contours or contour lines illustrated corresponds to an energy dose or process threshold, such that a three-dimensional profile can be easily represented graphically.

Since the predetermined height of approximately 10% from the wafer surface is the same for all the contours determined, overall a profile is thus obtained which reflects the behavior of the bottommost layer of the photoresist depending on the dose; this is also referred to as a so-called effective aerial image.

Figure 1:
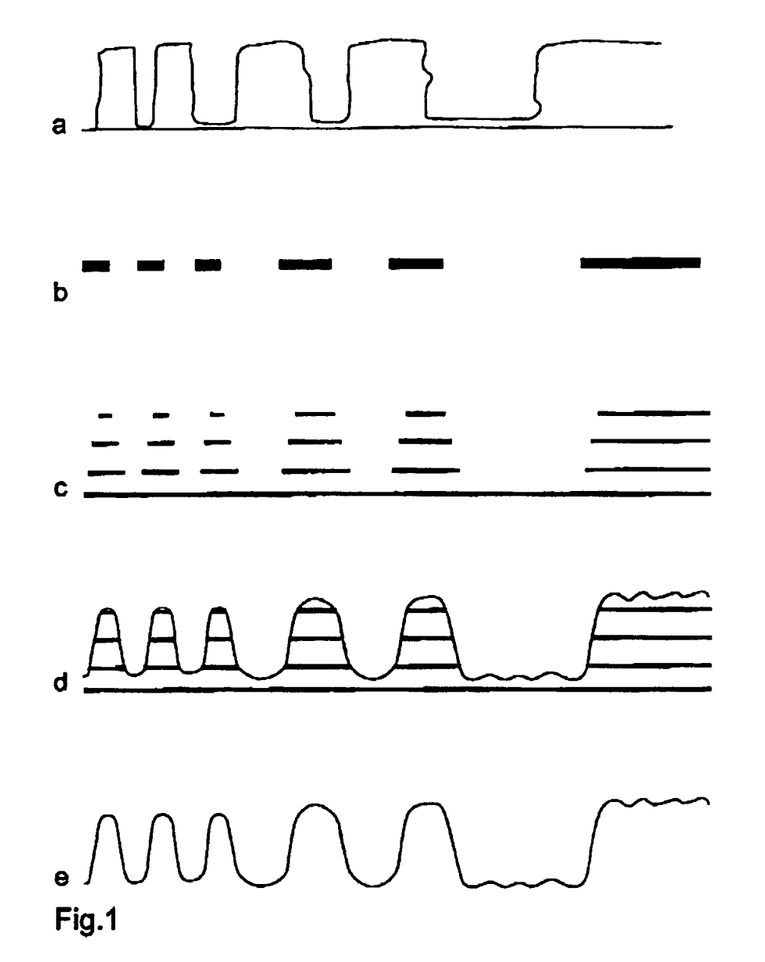
FIG. 1 shows the steps for creating a mask profile with regard to the reciprocal of the energy dose.
Figure 3:
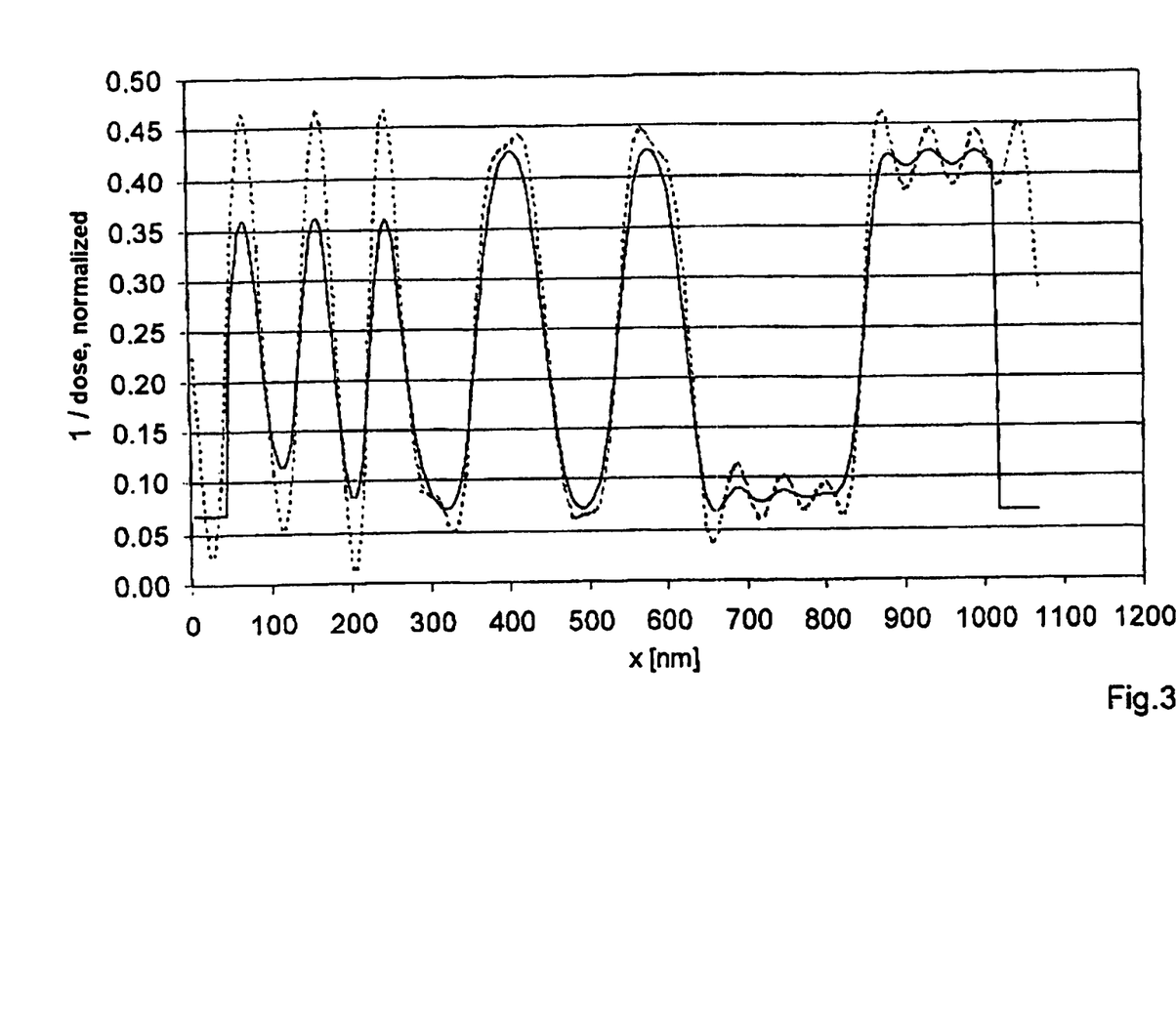
FIG. 3 shows a comparison of the profile from FIG. 1 with an aerial image recorded for the mask.

The effective aerial image shown in FIG. 1e can also be compared directly with the aerial image of the mask, as illustrated in FIG. 3. The direction on the wafer surface in nm which has already been taken as a basis in FIG. 1 is plotted on the X axis. The section through the aerial image, which can be generated for example by means of the AIMS from Carl Zeiss, is presented as a dashed line, and the profile whose generation has been described above is represented by the solid line. In this case, a so-called clear normalization has additionally been carried out for both curves: both the aerial image and the profile have been normalized to the exposure through a light-transmissive region of the mask without structures, such that the scale shown on the left, the normalized intensity and the reciprocal of the normalized process threshold can be represented in a graph. A value of 1 on the Y axis means that the dose is only of a magnitude such that the light which passes through a structureless region of the mask just suffices to expose the photoresist. A process threshold or an intensity of 0.25 means that even ¼ of the light which passes through the structureless region suffices to correspondingly expose the photoresist. In this case the dose is four times as high as in the case of a value of 1. On account of the diffusion, the contrast in the effective aerial image is lower. This also leads to a smoothing in the wider structures on the right-hand side in the graph in FIG. 3. The diffusion length is generally approximately 15 nm; this value can be fixedly predetermined, but it can also be left to the discretion of a user to input a value for a diffusion length. The value of the diffusion length can be calibrated in such a way that the effective aerial images correspond as well as possible to the behavior of the real resist images for different structure sizes and periods. This calibration is advantageously effected individually for each type of photoresist to be used.

Whereas the previous explanations contained the generation of a profile from a first aerial image at one focus setting, it can be advantageous to record further aerial images at further focus settings and to store them as further aerial image data records. These further aerial image data records are then transferred to the algorithm, and further contour data records, multicontour data records and subsequently further profiles are generated, which are stored in further profile data records and/or evaluated together with the initially calculated profile and/or output with the first profile jointly or in sections. This is illustrated for example in FIG. 4. The dashed lines correspond to a focus stack such as is obtained directly from the aerial images, which can be generated by means of the AIMS, for example. The solid lines correspond to profiles obtained by means of the method described above. Each focal plane in which a measurement is carried out corresponds to a height in the photoresist layer, measured from the surface of the wafer. The profile or the curve having the highest amplitudes corresponds to the so-called best focus plane, and the other curves lie more or less outside or inside the focus, relative to the distance to the objective.

Figure 4:
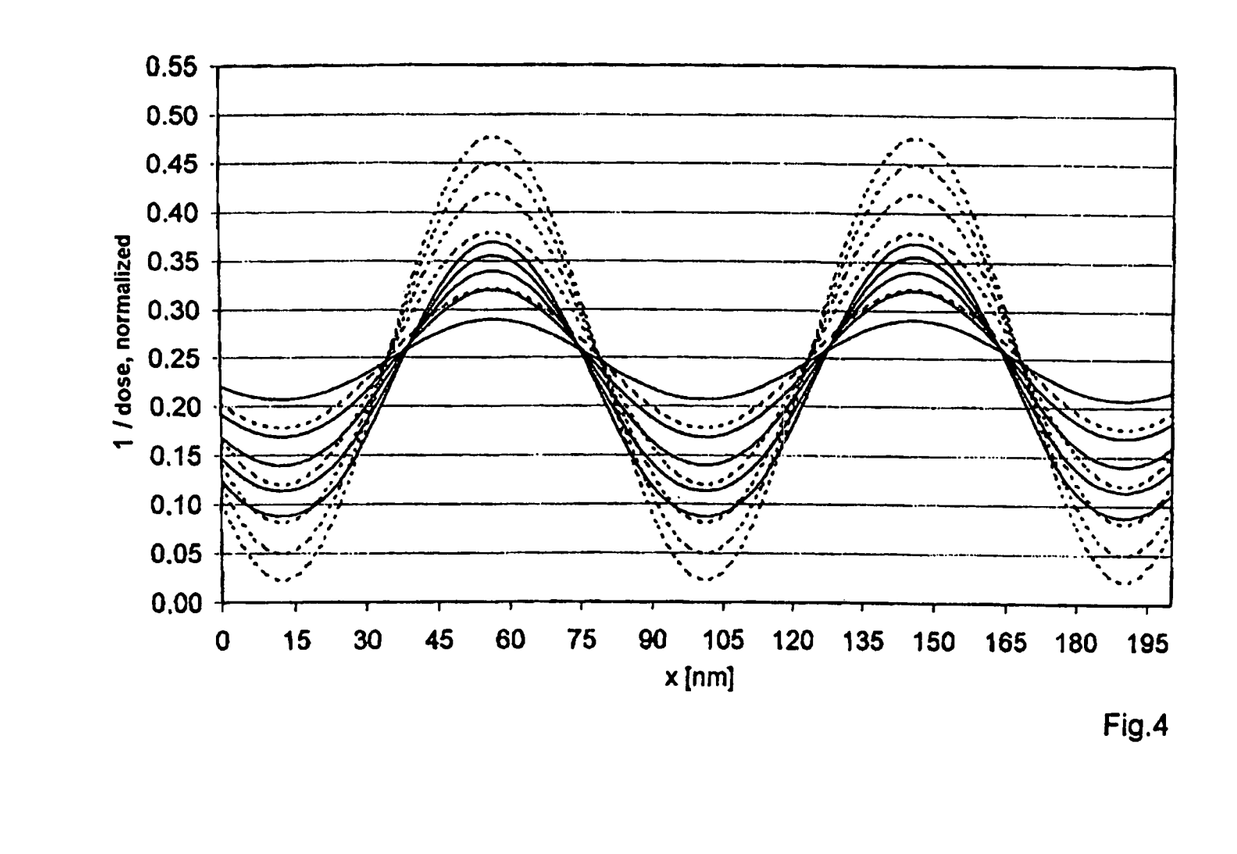
FIG. 4 shows a plurality of profiles for different focus settings.
Figure 5:
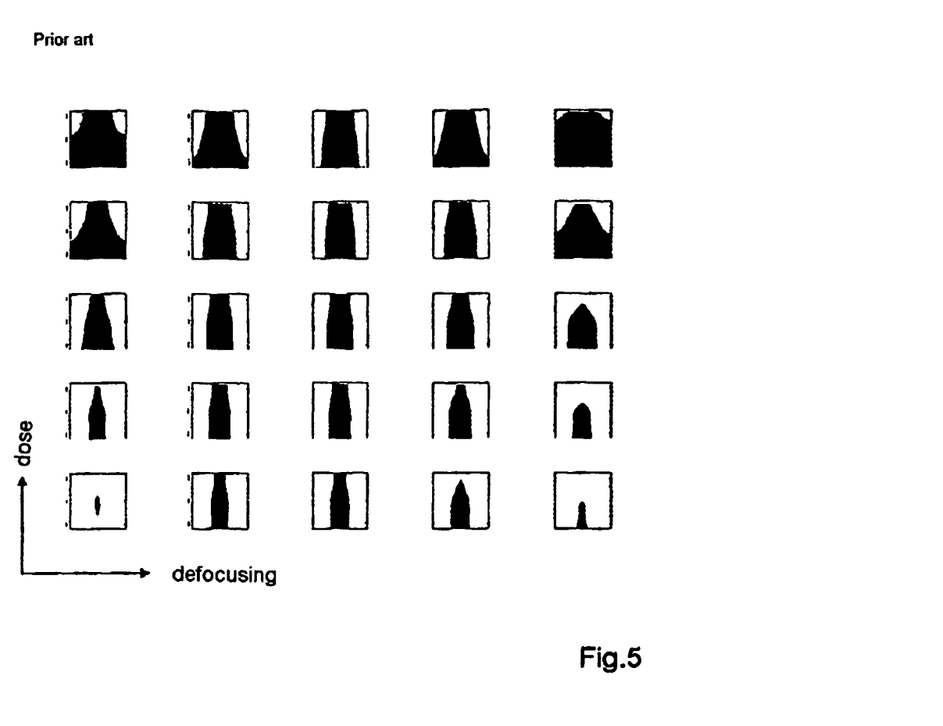
FIG. 5 shows an illustration of the exposure in accordance with the prior art.

In the prior art it is customary to carry out measurement or simulation series wherein the focus setting and the energy dose are varied in specific ranges, and, as shown in FIG. 5, to represent the result as a matrix of diagrams wherein the focus varies in one direction and the energy dose varies in the other direction. From this representation it is difficult to identify, without further aids, how specific parameters such as, for example, the line width vary depending on energy dose and/or focus setting. In contrast to this, from the aerial image measurements such as are illustrated in FIG. 4, it is readily possible to determine the pivot points, that is to say the points at which the various curves intersect or have their point of inflection. If the process threshold lies on the pivot point, then the line width does not change over the focus setting, that is to say that the lithography process would yield a constant width or critical dimension of the structures here even in the case of defocusing. However, the properties of the photoresist layer and its behavior in the case of defocusing are not taken into account here. On account of the chosen representation in the form of profiles, however, the pivot points can be determined even when an exposure simulation is interposed, but they vary slightly, as can be discerned from the figure. The position of the pivot points shifts, therefore, and therefore the extent of the contours also changes depending on the focusing. The degree to which this change becomes apparent can be gathered from FIG. 4. This representation is significantly clearer than the customary representation as a matrix of individual diagrams in FIG. 5 wherein one index of the matrix corresponds to the focus variation and the other index of the matrix corresponds to the dose variation. In the case of varying focusing, the pivot points correspond to the points at which the smallest changes arise in the position of the contours.

It goes without saying that it is also possible to take into account with the method the exposure with two or more masks, as is effected for example in the case of so-called double patterning. For one focus setting, aerial image data records can in this case be generated for both masks and be added pixel by pixel to the first aerial image data record. This corresponds to a double exposure of the photoresist layer without interposing a step in which the layer is developed. The first aerial image data record is then transferred to an algorithm in the manner described above, and various contour data records are generated, and finally a profile. This is also possible, of course, for a plurality of focus settings, such that sets of profiles with different focus settings can also be generated here.

The exposure of the wafer successively with at least two masks can also be taken into account in another way, by generating aerial image data records for both masks. The—first—aerial image data record for the mask used first to effect exposure is then transferred to the algorithm, wherein, for one or a plurality of mutually different energy doses, the exposure and development of a photoresist layer applied to the surface of a wafer are in each case determined on the basis of said aerial image data record. Subsequently, the aerial image data record for the mask used subsequently to effect exposure is transferred to the algorithm and a corresponding procedure is likewise adopted for one or a plurality of energy doses. In this case, the data generated from the aerial image record of the mask used first to effect exposure can in each case be taken into account. This corresponds to an interposed development of the photoresist after exposure with the first mask and the application of a new photoresist layer before exposure with the second mask.

Finally, the above-described analysis on the basis of the representation or evaluation of multicontour data records for photolithography processes can also be carried out with genuine resist profiles. For this purpose, a wafer is exposed by means of the mask and a projection exposure device such as a scanner for at least two energy doses and is subsequently developed, wherein, before each renewed exposure, the photoresist layer is renewed or else a different location of the wafer is used. After the development, the resist profiles produced are scanned, for example by means of a scanning electron microscope (SEM). The results are in each case stored in resist profile data records. On the basis of the resist profile data records, contours which separate regions with photoresist from those regions without photoresist are in each case determined, and the result is stored in each case as a two-dimensional contour data record. The contour data records are then combined to form a three-dimensional multicontour data record and represented and/or evaluated in the manner described above, that is to say that a three-dimensional profile of the energy dose or of a function of the energy dose depending on the position on the mask is generated.

Overall, the method described above affords advantages as far as the rapidity of the calculations is concerned, and through the special combination of the calculated data a clear representation, which permit a rapid evaluation including by a reviser.

The invention claimed is:

1. A method for analyzing masks for photolithography, wherein
   an aerial image of the mask for a first focus setting is generated and stored in a first aerial image data record,
   the aerial image data record is transferred to an algorithm that simulates photolithographic wafer exposures, wherein, for at least two mutually different energy doses, the exposure and development of a photoresist layer applied to the surface of a wafer are in each case simulated on the basis of the aerial image data record,
   at a predetermined height from the wafer surface, contours which separate regions with photoresist from regions without photoresist are in each case determined, and the result is stored for each of the energy doses in each case as a two-dimensional contour data record with the energy dose as a parameter,
   the contour data records are combined to form a three-dimensional multicontour data record with the energy dose or a function of the energy dose as a third dimension, in which the contour data records for the at least two different energy doses are associated with the same predetermined height from the wafer surface,
   on the basis of the transitions from zero to values different than zero in the contours in the multicontour data record, a three-dimensional first profile of the energy dose or of a function of the energy dose depending on the position on the mask is generated,
   and the profile and/or sections through the profile are/is output and/or stored in a profile data record and/or automatically evaluated.

2. The method as claimed in claim 1, wherein the aerial image is generated by means of an emulation imaging system that emulates the imaging of the mask onto a photoresist layer in a photolithography scanner.

3. The method of claim 2 in which aerial images at different focus settings are generated and combined to form a three-dimensional aerial image in the aerial image data record.

4. The method of claim 2 in which the contours are determined by carrying out for at least one section parallel to the wafer surface at the predetermined height after the simulation of the photolithographic exposure for each of the data records obtained from the simulation.

5. The method of claim 2 in which after the simulation of the photolithographic exposure, a layer is cut out parallel to the wafer surface at the predetermined height with a predetermined thickness from the data records obtained from the simulation of the photolithographic exposure and the contours are determined by averaging over the layer thickness.

6. The method of claim 2 in which during the simulation of the photolithographic exposure for each of the energy doses, the aerial image data record is subjected to two-dimensional convolution with a Gaussian function and a threshold value function is applied to the result, which threshold value function yields a value having a value different than zero when photoresist is present, and zero otherwise, and the result is in each case stored as a contour in a contour data record.

7. The method of claim 2 in which further aerial images at further focus settings are recorded and stored as further aerial image data records, and the latter are transferred to the algorithm, which generates further contour data records, multicontour data records and subsequently further profiles, which are stored in further profile data records and/or evaluated together with the first profile and/or output wholly or in sections.

8. The method as claimed in claim 1, wherein the aerial image is generated by means of an aerial image simulation algorithm.

9. The method as claimed in claim 1, wherein aerial images at different focus settings are generated and combined to form a three-dimensional aerial image in the aerial image data record.

10. The method as claimed in claim 1, wherein the contours are determined by carrying out for at least one section parallel to the wafer surface at the predetermined height after the simulation of the photolithographic exposure for each of the data records obtained from the simulation.

11. The method as claimed in claim 1, wherein after the simulation of the photolithographic exposure, a layer is cut out parallel to the wafer surface at the predetermined height with a predetermined thickness from the data records obtained from the simulation of the photolithographic exposure and the contours are determined by averaging over the layer thickness.

12. The method as claimed in claim 1, wherein during the simulation of the photolithographic exposure for each of the energy doses, the aerial image data record is subjected to two-dimensional convolution with a Gaussian function and a threshold value function is applied to the result, which threshold value function yields a value having a value different than zero when photoresist is present, and zero otherwise, and the result is in each case stored as a contour in a contour data record.

13. The method as claimed in claim 1, wherein further aerial images at further focus settings are recorded and stored as further aerial image data records, and the latter are transferred to the algorithm, which generates further contour data records, multicontour data records and subsequently further profiles, which are stored in further profile data records and/or evaluated together with the first profile and/or output wholly or in sections.

14. The method as claimed in claim 1, wherein pivot points are determined on the basis of the profiles, for which pivot points no significant changes in the position of the contours arise in the case of varying focusing.

15. The method as claimed in claim 1, wherein each profile is normalized to the exposure through a light-transmissive region of the mask.

16. The method as claimed in claim 1, wherein contrast losses as a result of vector effects are taken into account when generating each aerial image data record.

17. The method as claimed in claim 1, wherein approximately 10% of the original thickness of the photoresist layer is predetermined as height measured from the wafer surface.

18. The method as claimed in claim 1, wherein an exposure of the wafer successively with at least two masks is taken into account for the focus setting by virtue of aerial image data records being generated for both masks and being added pixel by pixel to the first aerial image data record.

19. The method as claimed in claim 1, wherein an exposure of the wafer successively with at least two masks is taken into account for a focus setting by virtue of
- aerial image data records being generated for both masks,
- the aerial image data record for the mask used first to effect exposure being transferred to the algorithm, wherein, for one or a plurality of mutually different energy doses, the exposure and development of a photoresist layer applied to the surface of a wafer are in each case simulated on the basis of said aerial image data record,
- the aerial image data record for the mask used subsequently to effect exposure is transferred to the algorithm, wherein, for one or a plurality of mutually different energy doses, the exposure and development of a photoresist layer applied to the surface of a wafer are in each case simulated on the basis of said aerial image data record and the resulting data are presented jointly.

20. A method for analyzing a photolithography process, wherein
- for at least two energy doses, a wafer is exposed and developed by means of a mask and a projection exposure device, with the result that resist profiles are generated,
- the resist profiles are scanned and stored electronically as resist profile data records,
- on the basis of the resist profile data records, at a predetermined height from the wafer surface, contours which separate regions with photoresist from regions without photoresist are in each case determined, and the result is stored for each of the energy doses in each case as a two-dimensional contour data record with the energy dose as a parameter,
- the contour data records are combined to form a three-dimensional multicontour data record with the energy dose or a function of the energy dose as a third dimension, in which the contour data records for the at least two different energy doses are associated with the same predetermined height from the wafer surface
- on the basis of the transitions from zero to values different than zero in the contours in the multicontour data record, a three-dimensional profile of the energy dose or of a function of the energy dose depending on the position on the mask is generated, and
- the profile and/or sections through the profile are/is output and/or stored in a profile data record and/or automatically evaluated.

* * * * *

UNITED STATES PATENT AND TRADEMARK OFFICE
CERTIFICATE OF CORRECTION

PATENT NO. : 8,718,354 B2
APPLICATION NO. : 12/934423
DATED : May 6, 2014
INVENTOR(S) : Ulrich Stroessner et al.

Page 1 of 1

It is certified that error appears in the above-identified patent and that said Letters Patent is hereby corrected as shown below:

On the Title Page

Column 2, (Attorney, Agent or Firm), delete "Richarson" and insert -- Richardson --

In the Claims

Column 11

Line 67, in claim 4, before "for" delete "by carrying out"

Column 12

Line 36, in claim 10, after "determined" delete "by carrying out"

Signed and Sealed this
Twenty-ninth Day of July, 2014

Michelle K. Lee
*Deputy Director of the United States Patent and Trademark Office*